United States Patent
Kwon et al.

(10) Patent No.: US 11,735,083 B2
(45) Date of Patent: Aug. 22, 2023

(54) DISPLAY DEVICE

(71) Applicant: SAMSUNG DISPLAY CO. LTD., Yongin-si (KR)

(72) Inventors: Tae Hoon Kwon, Yongin-si (KR); Ji Hyun Ka, Asan-si (KR); Byung Sun Kim, Hwaseong-si (KR); Yang Wan Kim, Hwaseong-si (KR); Hyung Jun Park, Seongnam-si (KR); Su Jin Lee, Seoul (KR); Jae Yong Lee, Asan-si (KR); Jin Tae Jeong, Suwon-si (KR); Seung Ji Cha, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 43 days.

(21) Appl. No.: 17/501,526

(22) Filed: Oct. 14, 2021

(65) Prior Publication Data

US 2022/0039258 A1 Feb. 3, 2022

Related U.S. Application Data

(62) Division of application No. 16/897,990, filed on Jun. 10, 2020, now Pat. No. 11,164,497, which is a
(Continued)

(30) Foreign Application Priority Data

Aug. 18, 2017 (KR) .......................... 10-2017-0105070

(51) Int. Cl.
*H05K 1/00* (2006.01)
*H05K 1/02* (2006.01)
(Continued)

(52) U.S. Cl.
CPC ........... *G09G 3/20* (2013.01); *G02F 1/13452* (2013.01); *H05K 1/111* (2013.01); *H05K 1/115* (2013.01);
(Continued)

(58) Field of Classification Search
CPC . H05K 1/00; H05K 1/02; H05K 1/111; H05K 1/118; H05K 1/189; G09G 3/20;
(Continued)

(56) References Cited

U.S. PATENT DOCUMENTS 9,123,599 B2 9/2015 Han et al.
9,332,649 B2 5/2016 Kim et al.
(Continued)

FOREIGN PATENT DOCUMENTS

CN 101175368 5/2008
CN 103809314 5/2014
(Continued)

OTHER PUBLICATIONS

Notice of Allowance dated May 24, 2022 in corresponding KR Application No. KR10-2017-0105070.
(Continued)

*Primary Examiner* — Xiaoliang Chen
(74) *Attorney, Agent, or Firm* — F. Chau & Associates, LLC

(57) ABSTRACT

A display device is provided. The display device comprises a display panel including a plurality of signal pads and one or more dummy pads, and at least one flexible wiring board providing signals to the signal pads, wherein a maximum bias period of signals provided to a pair of adjacent signal pads with at least one dummy pad interposed therebetween is longer than a maximum bias period of signals provided to a pair of adjacent signal pads with no dummy pad disposed therebetween.

4 Claims, 8 Drawing Sheets

Related U.S. Application Data division of application No. 16/039,908, filed on Jul. 19, 2018, now Pat. No. 10,713,988.

(51) Int. Cl.
*G09G 3/20* (2006.01)
*G09G 3/293* (2013.01)
*G09G 3/296* (2013.01)
*G09G 3/3233* (2016.01)
*G02F 1/1345* (2006.01)
*H05K 1/11* (2006.01)
*H10K 99/00* (2023.01)
*H05K 1/18* (2006.01)
*H10K 59/88* (2023.01)

(52) U.S. Cl.
CPC ............ *H05K 1/118* (2013.01); *H10K 99/00* (2023.02); *G09G 2300/0413* (2013.01); *G09G 2300/0426* (2013.01); *G09G 2310/0243* (2013.01); *G09G 2330/08* (2013.01); *H05K 1/189* (2013.01); *H05K 2201/09781* (2013.01); *H05K 2201/10128* (2013.01); *H10K 59/88* (2023.02)

(58) Field of Classification Search
CPC ...... G09G 3/293; G09G 3/296; G09G 3/2927; G09G 3/3233; G09G 3/3688; G09G 2300/043; G09G 2300/0413; G09G 2300/0426; G09G 2300/08; G09G 2300/0819; G09G 2300/0842; G09G 2300/0852; G09G 2300/0861; G09G 2300/0866; G09G 2310/066; G09G 2310/0232; G09G 2310/0243; G09G 2310/0262; G09G 2320/043; G09G 2320/0238; G09G 2330/04; G09G 2330/08
USPC ....... 361/767; 257/40; 345/60, 82, 204, 211, 345/690
See application file for complete search history.

(56) References Cited

U.S. PATENT DOCUMENTS

| | | | |
|---|---|---|---|
| 9,585,252 | B2 | 2/2017 | Yeo et al. |
| 9,589,881 | B2 | 3/2017 | Seo |
| 9,654,430 | B2 | 5/2017 | Nakano |
| 9,930,784 | B2 | 3/2018 | Lee |
| 9,961,763 | B2 | 5/2018 | Yeo et al. |
| 10,008,444 | B2 | 6/2018 | Seo |
| 10,713,988 | B2 | 7/2020 | Kwon et al. |
| 2003/0086049 | A1 | 5/2003 | Yamazaki et al. |
| 2004/0021653 | A1* | 2/2004 | Kim ................... G09G 3/2927 345/204 |
| 2004/0174487 | A1 | 9/2004 | Yamazaki et al. |
| 2005/0001793 | A1* | 1/2005 | Chung ................. G09G 3/296 345/60 |
| 2006/0250344 | A1* | 11/2006 | Kim ................. G09G 3/2927 345/99 |
| 2007/0097309 | A1 | 5/2007 | Matsumoto |
| 2008/0100763 | A1 | 5/2008 | Park |
| 2010/0085326 | A1 | 4/2010 | Anno |
| 2012/0019502 | A1* | 1/2012 | Kawagoshi .......... G09G 3/3688 345/211 |
| 2012/0299888 | A1 | 11/2012 | Kim et al. |
| 2013/0077005 | A1 | 3/2013 | Kim et al. |
| 2014/0131889 | A1 | 5/2014 | Kim et al. |
| 2014/0347401 | A1* | 11/2014 | Hwang ................ G09G 3/3233 345/82 |
| 2015/0002751 | A1 | 1/2015 | Hosoki |
| 2015/0098197 | A1 | 4/2015 | Abe et al. |
| 2015/0103500 | A1 | 4/2015 | Bae et al. |
| 2015/0108437 | A1* | 4/2015 | Cho ..................... G09G 3/3233 257/40 |
| 2015/0145847 | A1 | 5/2015 | Kim et al. |
| 2015/0220204 | A1 | 8/2015 | Noguchi et al. |
| 2015/0255739 | A1 | 9/2015 | Kim et al. |
| 2015/0309636 | A1 | 10/2015 | Kurasawa et al. |
| 2016/0079153 | A1 | 3/2016 | Seo |
| 2016/0321990 | A1* | 11/2016 | Kim ..................... G09G 3/3233 |
| 2017/0083133 | A1 | 3/2017 | Kang |
| 2017/0141015 | A1 | 5/2017 | Seo |
| 2018/0026051 | A1 | 1/2018 | Dong et al. |
| 2018/0107082 | A1 | 4/2018 | Sasaki et al. |
| 2019/0059156 | A1 | 2/2019 | Kwon et al. |
| 2020/0302850 | A1 | 9/2020 | Kwon et al. |

FOREIGN PATENT DOCUMENTS

| | | |
|---|---|---|
| CN | 103903586 | 1/2016 |
| CN | 107015407 | 8/2017 |
| CN | 105427784 | 6/2018 |
| CN | 105404063 | 9/2018 |
| KR | 10-0510439 | 8/2005 |
| KR | 10-2012-0131854 | 12/2012 |
| KR | 10-2015-0117999 | 10/2015 |
| KR | 10-2016-0043571 | 4/2016 |
| KR | 10-1630320 | 6/2016 |
| KR | 10-2017-0065718 | 6/2017 |
| KR | 10-2017-0080211 | 7/2017 |

OTHER PUBLICATIONS

Office Action dated Sep. 21, 2022 in corresponding CN Appln. No. 201810929012.0.
Final Office Action dated Jul. 8, 2019 in Corresponding U.S. Appl. No. 16/039,908.
Office Action dated Mar. 26, 2019 in Corresponding U.S. Appl. No. 16/039,908.
Office Action dated Nov. 19, 2019 in Corresponding U.S. Appl. No. 16/039,908.
Office Action dated Mar. 24, 2021 in Corresponding U.S. Appl. No. 16/897,990.

* cited by examiner

DISPLAY DEVICE

CROSS-REFERENCE TO RELATED APPLICATION

This application is a divisional application of U.S. patent application Ser. No. 16/897,990 filed Jun. 10, 2020, which is a divisional application of U.S. patent application Ser. No. 16/039,908 filed Jul. 19, 2018, issued as U.S. Pat. No. 10,713,988 on Jul. 14, 2020, which claims priority to Korean Patent Application No. 10-2017-0105070, filed on Aug. 18, 2017, and all the benefits accruing therefrom under 35 U.S.C. § 119, the disclosures of which are incorporated by reference in their entirety herein.

BACKGROUND

1. Technical Field

The present disclosure relates to a display device.

2. Discussion of Related Art

A display device generally includes a display panel, which generates an image, a main wiring board, and a flexible wiring board. Elements of the display device may be electrically connected to one another via pads for exchanging signals. However, the regions where the pads are disposed may be less durable than other regions since they are exposed to the air.

Further, moisture is likely to infiltrate into the display panel, the main wiring board, and the flexible wiring board through the regions where the pads are disposed. Moreover, the pads may become short-circuited by moisture that infiltrates into each of the display panel, the main wiring board, and the flexible wiring board, thereby causing defects in the display device.

SUMMARY

At least one exemplary embodiment of the present invention provides a display device capable of minimizing the occurrence of a short circuit between pads.

According to an exemplary embodiment of the present invention, there is provided a display device. The display device comprises a display panel including a plurality of signal pads and one or more dummy pads and at least one flexible wiring board providing signals to the signal pads, wherein a maximum bias period of signals provided to a pair of the signal pads adjacent one another with at least one dummy pad interposed therebetween is longer than a maximum bias period of signals provided to a pair of the signal pads adjacent one another with no dummy pad disposed therebetween.

According to an exemplary embodiment of the present invention, there is provided a display device. The display device comprises a display panel including first through n-th signal pads and a dummy pad, and at least one flexible wiring board providing signals to the first through n-th signal pads, wherein the dummy pad is disposed between k-th and (k+1)-th signal pads among the n signal pads, and a maximum bias period of signals provided to the k-th and (k+1)-th signal pads is longer than a maximum bias period of signals provided to another pair of the signal pads adjacent one another.

According to an exemplary embodiment of the present invention, there is provided a display device. The display device comprises a display panel and a flexible wiring board. The display panel includes a plurality of pixels, a plurality of signal input pads connected to a corresponding one of the pixels, and a dummy input pad disposed between a first pair of the signal input pads adjacent one another, wherein the dummy input pad is not connected to any of the pixels. The flexible wiring board includes a plurality of signal output pads connected to at least one of the signal input pads and a dummy output pad disposed between a first pair of the signal output pads and connected to the dummy input pad.

According to the aforementioned and other exemplary embodiments of the present invention, a display device capable of minimizing the occurrence of a short circuit between pads can be provided.

BRIEF DESCRIPTION OF THE DRAWINGS

The present invention will become more apparent by describing in detail exemplary embodiments thereof with reference to the attached drawings, in which.

DETAILED DESCRIPTION OF THE EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification.

As used herein, the singular forms "a," "an," and "the" are intended to include the plural forms, including "at least one," unless the content clearly indicates otherwise.

Hereinafter, exemplary embodiments of the present invention will be described in detail with reference to the accompanying drawings.

Figure 1:
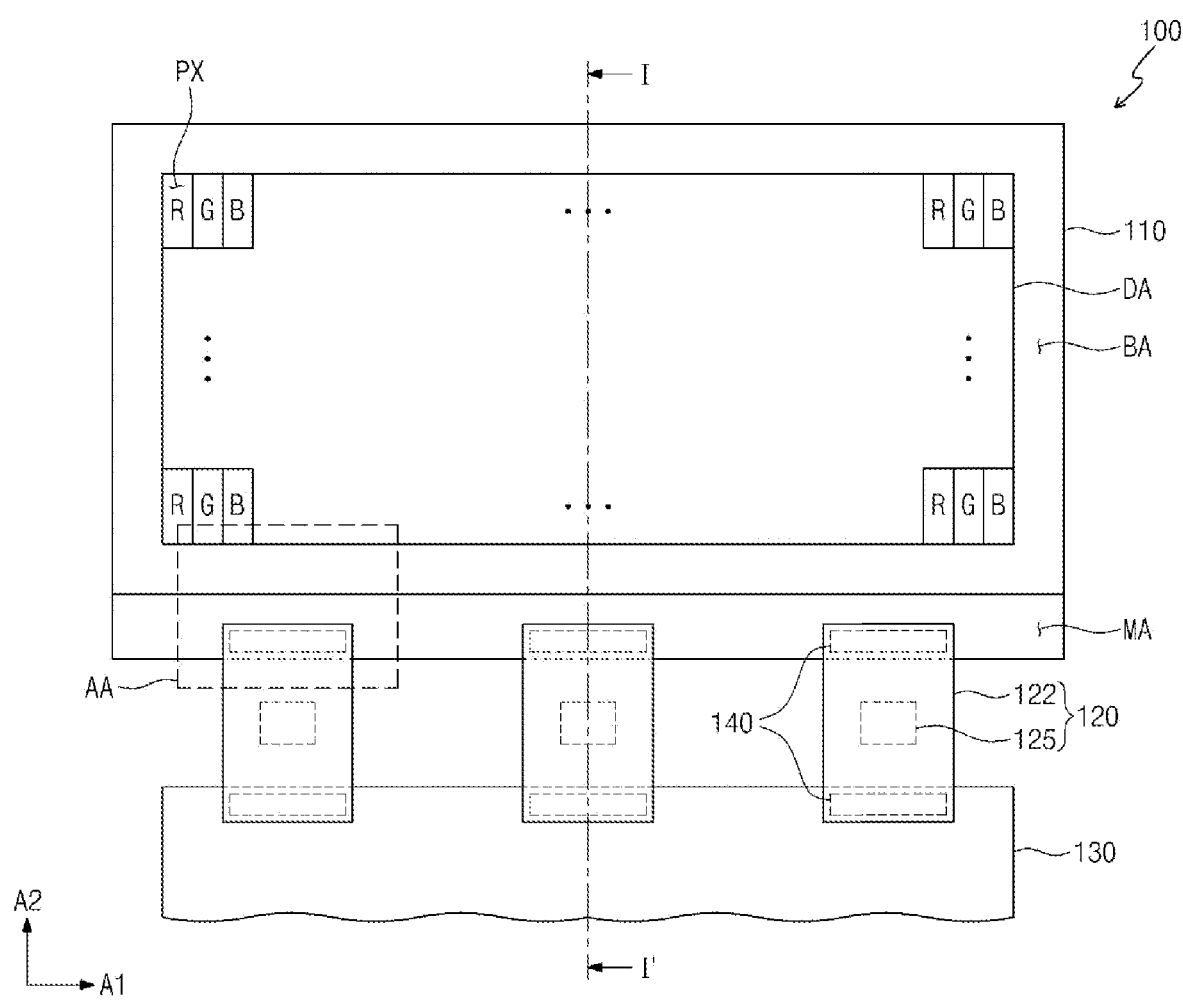
FIG. 1 is a layout view of a display device according to an exemplary embodiment of the present invention.
Figure 2:
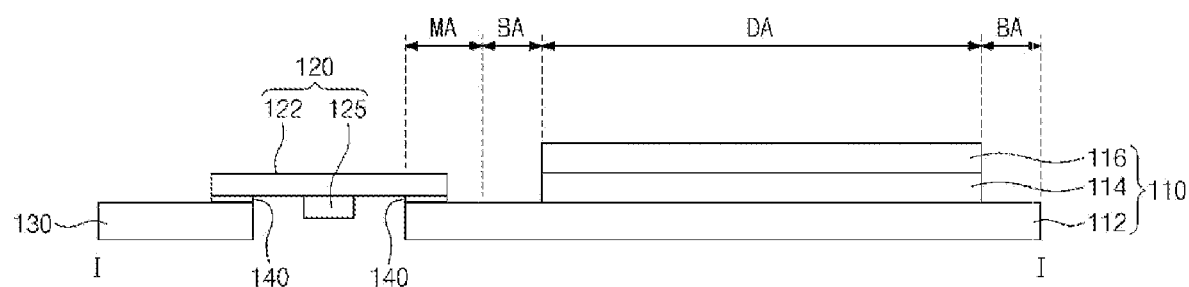
FIG. 2 is a cross-sectional view taken along line I-I' of FIG. 1.

FIG. 1 is a layout view of a display device according to an exemplary embodiment of the present invention, and FIG. 2 is a cross-sectional view taken along line I-I' of FIG. 1.

Referring to FIGS. 1 and 2, a display device 100 includes a display panel 110, one or more flexible wiring boards 120, and a main wiring board 130. The display panel 110, the flexible wiring boards 120, and the main wiring board 130 are electrically connected. For example, the flexible wiring boards 120 electrically connect the display panel 110 to the main wiring board 130. The display panel 110 may be an electro-optical panel, the flexible wiring boards 120 may be connection wiring boards, and the main wiring board 130 may be a main circuit board. The display device 100 is illustrated as having three flexible wiring boards 120, but embodiments of the present invention are not limited thereto. That is, the display device 100 may include only one flexible wiring board 120 depending on the purpose of use or the size thereof.

As illustrated in FIG. 1, the display panel 110 may display a desired image by applying driving signals to a plurality of pixels PX. The pixels PX may be arranged in a matrix form along first and second direction axes A1 and A2. In an exemplary embodiment, the pixels PX include first pixels PX, which display a red (R) color, second pixels PX, which display a green (G) color, and third pixels PX, which display a blue (B) color. In an exemplary embodiment, the pixels PX include first pixels PX, which display a white color, second pixels PX, which display a cyan color, and third pixels PX, which display a magenta color. The region where the pixels PX are disposed may be defined as a display area DA in which an image is actually displayed by the display panel 110.

The display panel 110 may be implemented by a liquid crystal display (LCD) panel or an organic light-emitting display panel depending on the type of the pixels PX. The display panel 110 will hereinafter be described as being, for example, an organic light-emitting display panel.

In a plan view, the display panel 110 is divided into the display area DA where the pixels PX are disposed, a non-display area BA where the pixels PX are not disposed, and a mounting area MA to which the flexible wiring boards 120 are coupled. The non-display area BA and the mounting area MA are not necessarily separate areas. Rather, part of the non-display area BA where elements for electrical connection to the flexible wiring board 120 are disposed may correspond to the mounting area MA.

As illustrated in FIG. 2, the display panel 110 includes a display substrate 112, a display element layer 114, which is disposed on the display substrate 112, and an encapsulation layer 116, which is disposed on the display element layer 114. The display substrate 112 may include a base substrate, a plurality of insulating layers, which are disposed on the base substrate, a functional layer, and a conductive layer. The conductive layer may include gate wiring (not illustrated), data wiring (not illustrated), and other signal wiring. The conductive layer may further include a plurality of pads (not illustrated) connected to the gate wiring, the data wiring, and the signal wiring. The gate wiring, the data wiring, and the signal wiring may provide driving signals to the pixels PX.

The display element layer 114 is disposed on the display substrate 112. The display element layer 114 may include a plurality of insulating layers, a functional layer, and a conductive layer, which form the pixels PX. The functional layer may include an organic light-emitting layer. In an embodiment, the display element layer 114 is only present in the display area DA and does not extend into the non-display area BA or the mounting area MA.

The encapsulation layer 116 is disposed on the display element layer 114. The encapsulation layer 116 may protect the display element layer 114. Although not specifically illustrated, the encapsulation layer 116 may cover the sides of the display element layer 114. In an embodiment, a width of the display element layer 144 is less than a width of the encapsulation layer 116 so that the encapsulation layer 116 can cover the sides of the display element layer 114. The encapsulation layer 116 may be omitted or replaced with another display substrate depending on the type of the display panel 110.

In an exemplary embodiment, a black matrix (not illustrated) is disposed in the non-display area Ba. In an exemplary embodiment, a gate driving circuit (not illustrated) for providing a gate signal to the pixels PX is provided in the non-display area BA. In an exemplary embodiment, a data driving circuit (not illustrated) is further provided in the non-display area BA. The data driving circuit may provide a data signal to the pixels PX. In an embodiment, pads (not illustrated) for receiving signals from the flexible wiring boards 120 are disposed in the mounting area MA.

As illustrated in FIGS. 1 and 2, each of the flexible wiring boards 120 includes a flexible wiring board 122 and a data driving circuit 125. The data driving circuit 125 may include at least one driving chip. The data driving circuit 125 may be electrically connected to wiring of the flexible wiring board 122.

In an embodiment where each of the flexible wiring boards 120 includes the data driving circuit 125, the pads disposed in the display panel 110 include data pads, which are electrically connected to data wiring, and control signal pads, which are electrically connected to control signal wiring. The data wiring may be connected to the pixels PX, and the control signal wiring may be connected to the gate driving circuit. The flexible wiring boards 120 are illustrated as having a chip-on-film (COF) structure, but embodiments of the present invention are not limited thereto.

From the viewpoint of FIG. 2, the data driving circuit 125 is disposed on the bottom of each of the flexible wiring boards 120, but embodiments of the present invention are not limited thereto. That is, alternatively, from the viewpoint of FIG. 2, the data driving circuit 125 may be disposed on the top of each of the flexible wiring boards 120.

The flexible wiring boards 120 will hereinafter be described with reference to FIG. 3.

Figure 3:
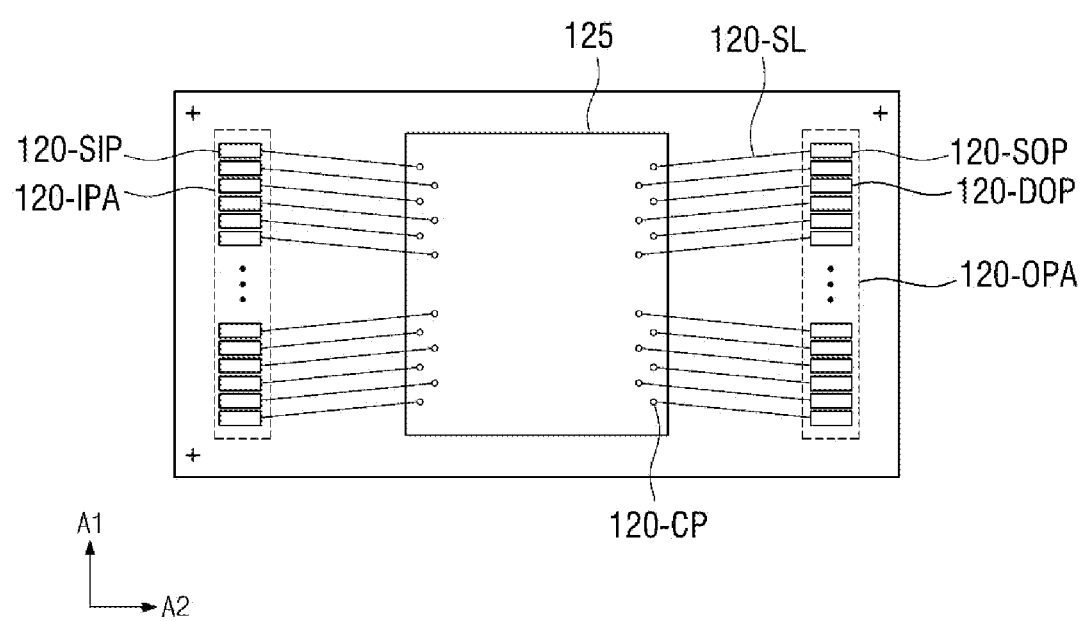
FIG. 3 is a layout view of a flexible wiring board of FIG. 1.

FIG. 3 is a layout view of a flexible wiring board of FIG. 1 according to an exemplary embodiment of the invention.

Referring to FIG. 3, a flexible wiring board 120 includes an insulating layer (not illustrated), a plurality of pads (120-CP, 120-SIP, 120-SOP, and 120-DOP), and a plurality of wires 120-SL. The plurality of pads (120-CP, 120-IP, 120-SOP, and 120-DOP) are disposed on the insulating layer. In an embodiment, the insulating layer comprises polyimide (PI).

The plurality of pads (120-CP, 120-SIP, 120-SOP, and 120-DOP) may include connection pads 120-CP, which are connected to connection terminals (not illustrated) of a data driving circuit 125, signal input pads 120-SIP, which are connected to the main wiring board 130, and signal output pads 120-SOP and dummy output pads 120-DOP, which are connected to the display panel 110. The signal input pads 120-SIP are disposed in an input pad area 120-IPA, which is disposed on one side of the flexible wiring board 120, and the signal output pads 120-SOP and the dummy output pads 120-DOP are disposed in an output pad area 120-OPA, which is disposed on the other side of the flexible wiring board 120. The connection pads 120-CP may be arranged on both sides of the data driving circuit 125, as illustrated in FIG. 3. Alternatively, the connection pads 120-CP may be randomly arranged to correspond to the connection terminals of the data driving circuit 125.

The signal input pads 120-SIP are illustrated as, but are not limited to, being disposed in a single row in the input pad area 120-IPA, and the signal output pads 120-SOP and the dummy output pads 120-DOP are illustrated as, but are not limited to, being disposed in a single row in the output pad area 120-OPA. Alternatively, the signal input pads 120-IP may be disposed in a plurality of rows in the input pad area 120-IPA, and the signal output pads 120-SOP and the dummy output pads 120-DOP may be disposed in a plurality of rows in the output pad area 120-OPA.

Some of the wires 120-SL connect the connection pads 120-CP and the signal input pads 120-SIP, and the other wires 120-SL connect the connection pads 120-CP and the signal output pads 120-SOP or the dummy output pads 120-DOP. Although not specifically illustrated, the wires 120-SL may directly connect some of the signal input pads 120-SIP and some of the signal output pads 120-SOP or some of the signal input pads 120-SIP and some of the dummy output pads 120-DOP. For example, one of the signal wires 120-SL may connect a signal input pad 120-SIP to a signal output pad 120-SOP without passing through the data driving circuit 125. In an exemplary embodiment, the wires 120-SL directly connect all the signal input pads 120-SIP and all the signal output pads 120-SOP or all the signal input pads 120-IP and all the dummy output pads 120-DOP.

Referring again to FIGS. 1 and 2, the main wiring board 130 may provide image data, control signals, and a power voltage to the display panel 110 or the data driving circuit 125. The main wiring board 130, which is a different wiring board from the flexible wiring boards 120, may include active elements and passive elements. The main wiring board 130 may be a flexible or rigid wiring board and may include pads (not illustrated) connected to the flexible wiring boards 120.

It will hereinafter be described how the flexible wiring boards 120 and the display panel 110 are connected.

Figure 4:
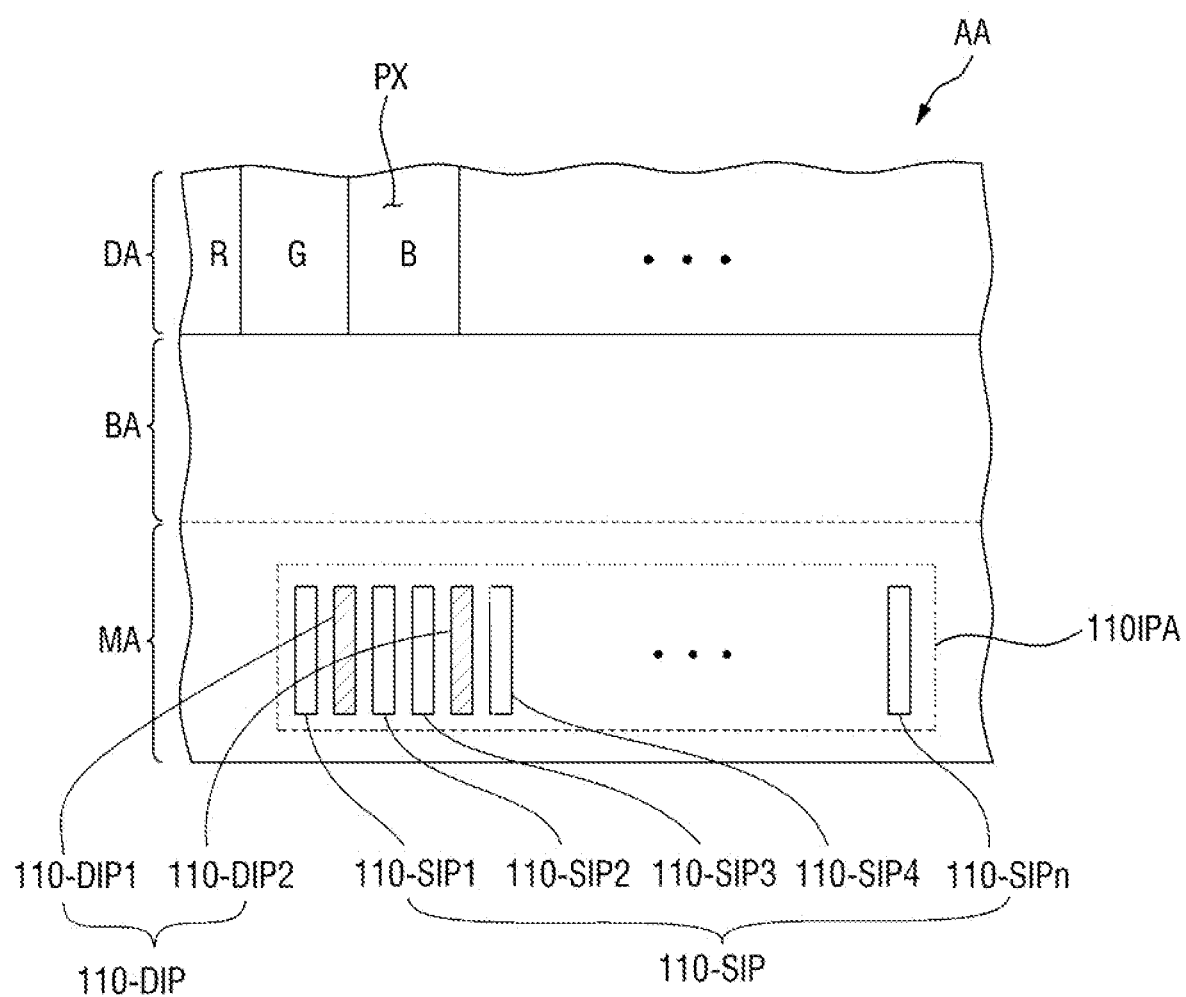
FIG. 4 is an enlarged layout view of an area AA of the display panel of FIG. 1 that is yet to be connected to a flexible wiring board according to an exemplary embodiment of the invention.
Figure 5:
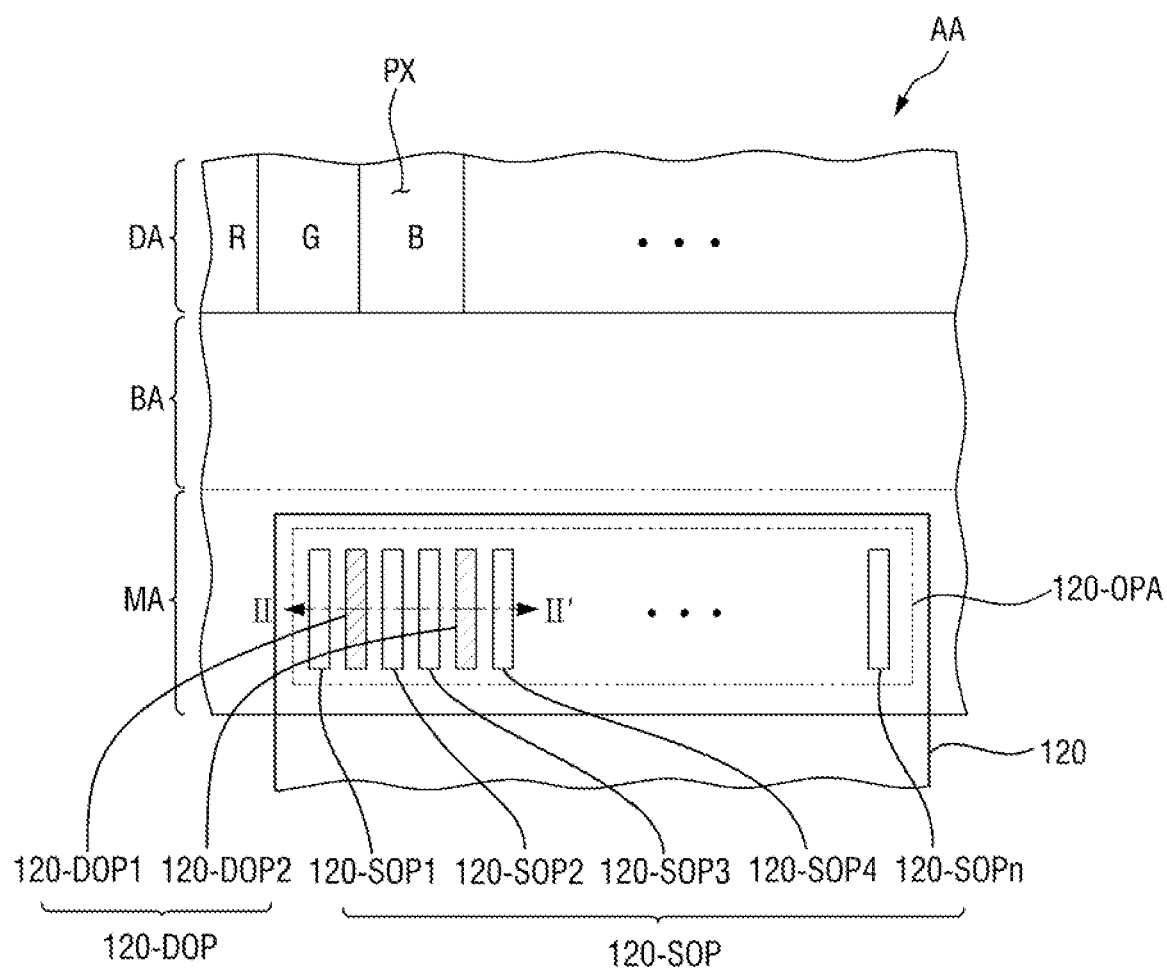
FIG. 5 is an enlarged layout view of the area AA of the display panel of FIG. 1 that is connected to a flexible wiring board according to an exemplary embodiment of the invention.
Figure 6:
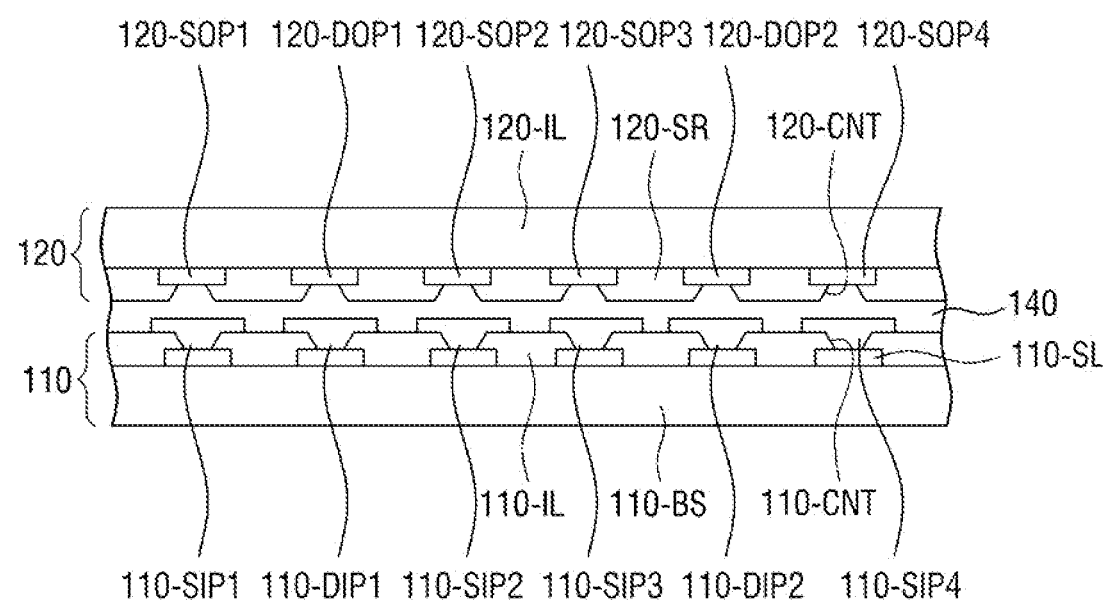
FIG. 6 is a cross-sectional view taken along line II-II' of FIG. 5 according to an exemplary embodiment of the invention.

FIG. 4 is an enlarged layout view of an area AA of the display panel of FIG. 1 that is yet to be connected to a flexible wiring board, FIG. 5 is an enlarged layout view of the area AA of the display panel of FIG. 1 that is connected to a flexible wiring board, and FIG. 6 is a cross-sectional view taken along line II-II' of FIG. 5.

Referring to FIGS. 4 and 5, the display panel 110 includes signal input pads 110-SIP, which correspond to signal output pads 120-SOP of a flexible wiring board 120, and dummy input pads 110-DIP, which correspond to dummy output pads 120-DOP of the flexible wiring board 120. For example, the signal input pads 110-SIP of the display panel 110 are configured to connect to respective signal output pads 120-SOP of the flexible wiring board 120, and the dummy input pads 110-DIP of the display panel 110 are configured to connect to respective dummy output pads 120-DIP of the flexible wiring board 120. The dummy input pads 110-DIP and the signal input pads 110-SIP of the display panel 110 are disposed in an input pad area 110-IPA of the display panel 110. The signal input pads 110-SIP and the dummy input pads 110-DIP of the display panel 110 are illustrated as corresponding one-on-one to the signal output pads 120-SOP and the dummy output pads 120-DOP of the flexible wiring board 120, but embodiments of the present invention are not limited thereto. That is, alternatively, the numbers of signal input pads 110-SIP and dummy input pads 110-DIP of the display panel 110 may differ from the numbers of signal output pads 120-SOP and dummy output pads 120-DOP of the flexible wiring board 120, and the signal input pads 110-SIP and the dummy input pads 110-DIP of the display panel 110 may be arranged in a different number of rows from the signal output pads 120-SOP and the dummy output pads 120-DOP of the flexible wiring board 120. For example, one of the signal input pads 110-SIP of the display panel 110 could be connected to two or more of the signal output pads 120-SOP of the flexible wiring board 120, one of the signal output pads 120-SOP of the flexible wiring board 120 could be connected to two or more of the signal input pads 110-SIP of the display panel 110, etc.

In an exemplary embodiment, the signal output pads 120-SOP and the dummy output pads 120-DOP of the flexible wiring board 120 are electrically connected to the signal input pads 110-SIP and the dummy input pads 110-DIP of the display panel 110. The signal output pads 120-SOP and the dummy output pads 120-DOP of the flexible wiring board 120 are illustrated as completely overlapping with the signal input pads 110-SIP and the dummy input pads 110-DIP of the display panel 110, but embodiments of the present invention are not limited thereto. That is, in an alternative embodiment, the signal output pads 120-SOP and the dummy output pads 120-DOP of the flexible wiring board 120 partially overlap with the signal input pads 110-SIP and the dummy input pads 110-DIP of the display panel 110.

Referring to FIG. 6, wires 110-SL are disposed on a base substrate 110-BS of the display panel 110. An insulating layer 110-IL of the display panel 110 is disposed on the base substrate 110-BS. The insulating layer 110-IL of the display panel 110 may include a barrier layer and a passivation layer. In an embodiment, the signal input pads 110-SIP and the dummy input pads 110-DIP of the display panel 110 are disposed on the insulating layer 110-IL of the display panel 110. The signal input pads 110-SIP and the dummy input pads 110-DIP of the display panel 110 may be connected to the wires 110-SL of the display panel 110 through holes 110-CNT, which are formed to penetrate the insulating layer 110-IL of the display panel 110.

In an embodiment, the wires (120-SL of FIG. 3) of the flexible wiring board 120 and the signal output pads 120-SOP and the dummy output pads 120-DOP of the flexible wiring board 120, which are connected to the wires (120-SL of FIG. 3) of the flexible wiring board 120, are disposed on an insulating layer 120-IL of the flexible wiring board 120.

In an embodiment, a solder resist layer 120-SR is disposed on the insulating layer 120-IL of the flexible wiring board 120. The signal output pads 120-SOP and the dummy output pads 120-DOP of the flexible wiring board 120 may be exposed via the through holes 120-CNT, which are formed in the solder resist layer 120-SR. In an exemplary embodiment, the solder resist layer 120-SR of the flexible wiring board 120 covers only the wires (120-SL of FIG. 3) of the flexible wiring board 120, but not the signal output pads 120-SOP and the dummy output pads 120-DOP of the flexible wiring board 120.

In an embodiment, the signal output pads 120-SOP and the dummy output pads 120-DOP of the flexible wiring board 120 and the signal input pads 110-SIP and the dummy input pads 110-DIP of the display panel 110 are electrically connected via a conductive adhesive film 140. Although not specifically illustrated, the signal output pads 120-SOP and the dummy output pads 120-DOP of the flexible wiring board 120 and the signal input pads 110-SIP and the dummy input pads 110-DIP of the display panel 110 are electrically connected via a plurality of conductive balls included in the conductive adhesive film 140. The conductive adhesive film 140 may be an anisotropic conductive film (ACF). In an exemplary embodiment, solder bumps replace the conductive adhesive film 140.

In a case where the display panel 110 and the flexible wiring board 120 are exposed to a humid environment, a pair of adjacent pads are likely to be short-circuited. Specifically, in a case where the display panel 110 and the flexible wiring board 120 are exposed to a humid environment, a pair of adjacent signal input pads 110-SIP of the display panel 110 or a pair of adjacent signal output pads 120-SOP of the flexible wiring board 120 may be short-circuited. In a case where a pair of adjacent signal input pads 110-SIP of the display panel 110 or a pair of adjacent signal output pads 120-SOP of the flexible wiring board 120 are short-circuited, the display device 100 may not operate properly.

Short circuits may occur frequently, especially when the period (hereinafter, the maximum bias period) during which the difference in voltage between signals provided to a pair of adjacent signal input pads 110-SIP of the display panel 110 or between signals provided to a pair of adjacent signal output pads 120-SOP of the flexible wiring board 120 is maintained to be greater than a reference value is elongated. For example, if a first voltage is applied to a first signal input pad and a second voltage is applied to a second adjacent input pad during a certain period, and the difference between the first voltage and the second voltage exceeds a reference voltage, the chance of a short circuit between the first and second adjacent signal input pads increases as this certain period increases.

Accordingly, if a maximum bias period of signals provided to a pair of adjacent signal input pads 110-SIP of the display panel 110 is longer than a maximum bias period of signals provided to a pair of other non-adjacent signal input pads 110-SIP of the display panel 110, a dummy input pad 110-DIP may be disposed between the pair of adjacent signal input pads 110-SIP, thereby minimizing the occurrence of a short circuit.

Similarly, if a maximum bias period of signals provided to a pair of adjacent signal output pads 120-SOP of the flexible wiring board 120 is longer than a maximum bias period of a pair of other non-adjacent signal input pads 120-SOP of the flexible wiring board 120, a dummy output pad 120-DOP may be disposed between the pair of adjacent signal output pads 120-SOP, thereby minimizing the occurrence of a short circuit.

That is, the dummy output pads 120-DOP may be disposed between some signal output pads 120-SOP of the flexible wiring board 120, and the dummy input pads 110-DIP may be disposed between some signal input pads 110-SIP of the display panel 110 that are electrically connected to the signal output pads 120-SOP between which the dummy output pads 120-DOP are disposed.

The dummy input pads 110-DIP of the display panel 110 and the dummy output pads 120-DOP of the flexible wiring board 120 may be in a floating state, i.e., in a state where no particular signals are provided, but embodiments of the present invention are not limited thereto. That is, alternatively, the dummy input pads 110-DIP of the display panel 110 and the dummy output pads 120-DOP of the flexible wiring board 120 may be provided with a predetermined voltage. For example, the predetermined voltage may be an intermediate voltage between a high bias voltage VGH and a low bias voltage VGL of a driving chip that will be described later.

The arrangement of pads in the display device 100 will hereinafter be described with reference to FIGS. 4 through 6.

Referring to FIGS. 4 through 6, the flexible wiring board 120 of the display device 100 includes first through n-th signal output pads 120-SOP1 through 120-SOPn (e.g., 120-SOP1, 120-SOP2, 120-SOP3, 120-SOP4, ..., 120-SOPn) and first and second dummy output pads 120-DOP1 and 120-DOP2. The display panel 110 may include first through n-th signal input pads 110-SIP1 through 110-SIPn (e.g., 110-SIP1, 110-SIP2, 110-SIP3, 110-SIP4, ..., 110-SIPn) and first and second dummy input pads 110-DIP1 and 110-DIP2.

It is assumed that a signal provided to the first signal input pad 110-SIP1 of the display panel 110 via the first signal output pad 120-SOP1 of the flexible wiring board 120 and a signal provided to the second signal input pad 110-SIP2 of the display panel 110 via the second signal output pad 120-SOP2 of the flexible wiring board 120 have a relatively long maximum bias period. In this case, the first dummy output pad 120-DOP1 is disposed between the first and second signal output pads 120-SOP1 and 120-SOP2 of the flexible wiring board 120. In an embodiment, the first dummy input pad 110-DIP1 is disposed between the first and second signal input pads 110-SIP1 and 110-SIP2 of the display panel 110.

Similarly, it is assumed that a signal provided to the third signal input pad 110-SIP3 of the display panel 110 via the third signal output pad 120-SOP3 of the flexible wiring board 120 and a signal provided to the fourth signal input pad 110-SIP4 of the display panel 110 via the fourth signal output pad 120-SOP4 of the flexible wiring board 120 have a relatively long maximum bias period. In an embodiment, the second dummy output pad 120-DOP2 is disposed between the third and fourth signal output pads 120-SOP3 and 120-SOP4 of the flexible wiring board 120. In an embodiment, the second dummy input pad 110-DIP2 is disposed between the third and fourth signal input pads 110-SIP3 and 110-SIP4 of the display panel 110.

On the other hand, it is assumed that a signal provided to the second signal input pad 110-SIP2 of the display panel 110 via the second signal output pad 120-SOP2 of the flexible wiring board 120 and a signal provided to the third signal input pad 110-SIP3 of the display panel 110 via the third signal output pad 120-SOP3 of the flexible wiring board 120 have a relatively short maximum bias period. In this case, the second and third signal output pads 120-SOP2 and 120-SOP3 of the flexible wiring board 120 are disposed next to each other. In an embodiment, the second and third signal input pads 110-SIP2 and 110-SIP3 of the display panel 110 are disposed next to each other.

In an exemplary embodiment, a dummy input pad (e.g., 110-DIP1) of the display panel 110 is not connected to any pixel PX of the display panel 110. In an exemplary embodiment, a dummy output pad (e.g., 120-DOP1) of the flexible wiring board 120 is not connected to the data driving circuit 125. In an exemplary embodiment, a signal input pad (e.g., 110-W1) of the display panel 110 can be configured to be a dummy input pad by disconnecting the signal input pad from all the pixels. For example, a switch may be disposed between the signal input pad and a given pixel, and a control signal may be applied to the switch to disconnect the signal input pad from the given pixel. In an exemplary embodiment, a signal output pad (e.g., 120-SOP1) of the flexible wiring board 120 can be configured to be a dummy output pad by disconnecting the signal output pad from the data driving circuit 125. For example, a switch may be disposed between the signal output pad and the data driving circuit 125, and a control signal may be applied to the switch to disconnect the signal output pad from the data driving circuit 125. In an embodiment, the configuring of a given pad into a dummy pad can be performed upon determining that a maximum bias period of signals supplied to two adjacent pads is within a certain range. In an embodiment, the display device 100 includes a control circuit that provides the control signal. In an embodiment, the control circuit is located within the data driving circuit 125.

A standard for detecting a maximum bias period based on the waveforms of signals provided to a pair of adjacent pads will hereinafter be described with reference to FIG. 7.

Figure 7:
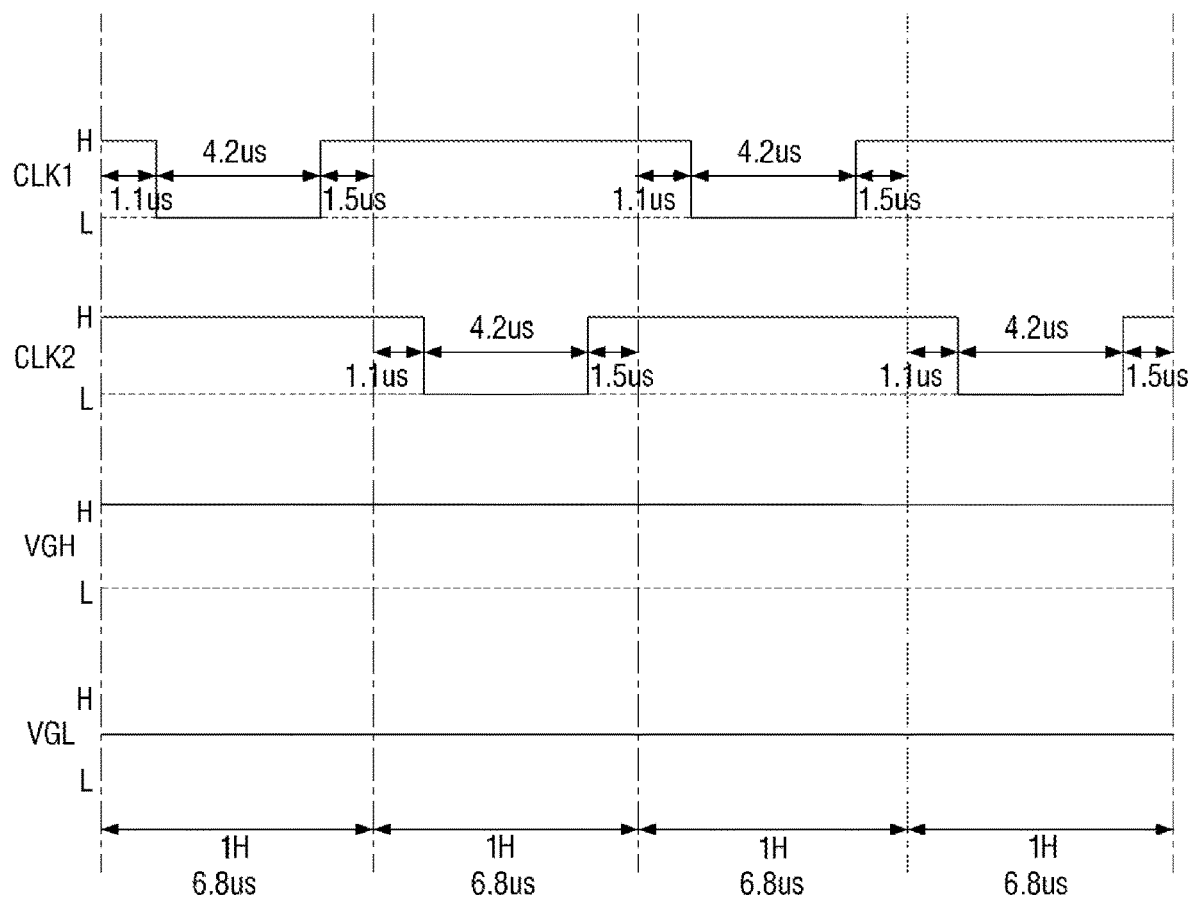
FIG. 7 is a diagram showing the waveforms of various signals according to an exemplary embodiment of the present invention.

FIG. 7 is a diagram showing the waveforms of various signals according to an exemplary embodiment of the present disclosure.

FIG. 7 shows a variety of signals for driving the display device 100, and signals that may be provided to the pads (110-SIP, 110-DIP, 120-SOP, and 120-DOP) of the display device 100, but are not limited to the signals shown in FIG. 7.

Specifically, FIG. 7 shows the waveforms of a first clock signal CLK1, a second clock signal CLK2, the high bias voltage VGH, and the low bias voltage VGL. The first clock signal CLK1, the second clock signal CLK2, the high bias voltage VGH, and the low bias voltage VGH may be output from the data driving circuit 125.

The first clock signal CLK1 may be provided to the first signal input pad 110-W1 of the display panel 110 via the first signal output pad 120-SOP1 of the flexible wiring board 120. The second clock signal CLK2 may be provided to the second signal input pad 110-SIP2 of the display panel 110 via the second signal output pad 120-SOP2 of the flexible wiring board 120. The high bias voltage VGH may be provided to the third signal input pad 110-SIP3 of the display panel 110 via the third signal output pad 120-SOP3 of the flexible wiring board 120.

The low bias voltage VGL may be provided to the fourth signal input pad 110-SIP4 of the display panel 110 via the fourth signal output pad 120-SOP4 of the flexible wiring board 120.

The first clock signal CLK1, the second clock signal CLK2, the high bias voltage VGH, and the low bias voltage VGL may be output from the same data driving circuit 125. Accordingly, the first clock signal CLK1, the second clock signal CLK2, the high bias voltage VGH, and the low bias voltage VGL may have either a high level or a low level.

Accordingly, a maximum bias period may be defined as a period in which a high-level voltage and a low-level voltage are provided to a pair of adjacent signal input pads, respectively. A maximum bias period may also be defined as a period in which a high-level voltage and a low-level voltage is provided to a pair of adjacent signal output pads, respectively A decision may be made as to whether to dispose a dummy input pad or a dummy output pad between a particular pair of adjacent signal input pads or between a particular pair of adjacent signal output pads based on the length of a maximum bias period of signals provided to the particular pair of adjacent signal input pads or the particular pair of adjacent signal output pads. The maximum bias ratio may be defined by Equation (1) as follows:

$$\text{Maximum Bias Ratio (\%)} = (\text{Maximum Bias Period}/\text{Entire Period of Time}) * 100 \quad \text{Equation (1)}.$$

If signals provided to two pads have periodicity, Equation (1) may be simplified into Equation (2) as follows:

$$\text{Maximum Bias Ratio (\%)} = (\text{Maximum Bias Period per Period of Signal Difference between Two Pads}/\text{Period of Signal Difference between Two Pads}) * 100 \quad \text{Equation (2)}$$

where "Period of Signal Difference between Two Pads" is defined as a minimum period of time for which the waveform of the difference in voltage between signals provided to a pair of adjacent signal output pads or a pair of adjacent signal input pads has periodicity.

The calculation of a maximum bias ratio based on the waveforms of the signals of FIG. 7 will hereinafter be described.

Referring to FIG. 7, the length of the period of the difference between the first and second clock signals CLK1 and CLK2 may correspond to the sum of two horizontal periods (1H+1H), i.e., 13.6 μs (=6.8+6.8). In an embodiment, the length of a maximum bias period per period of the difference between the first and second clock signals CLK1 and CLK2 is the sum of the length of a period during which the first clock signal CLK1 is maintained at a low level and the second clock signal CLK2 is maintained at a high level and the length of a period during which the first clock signal CLK1 is maintained at a high level and the second clock signal CLK2 is maintained at a low level, i.e., 8.4 μs (=4.2+4.2). Accordingly, the maximum bias ratio of the first and second clock signals CLK1 and CLK2 may be 62% (=(8.4 μs/13.6 μs)*100).

In this manner, the maximum bias ratio of the second clock signal CLK2 and the high bias voltage VGH, which are provided to a pair of adjacent pads, respectively, may be calculated to be 31%, and the maximum bias ratio of the high bias voltage VGH and the low bias voltage VGH, which are provided to another pair of adjacent pads, respectively, may be calculated to be 100%.

In an exemplary embodiment where four signal input pads (i.e., the first through fourth signal input pads 110-SIP1 through 110-SIP4), four signal output pads (i.e., the first through fourth signal output pads 120-SOP1 through 120-SOP4), two dummy input pads (i.e., the first and second dummy input pads 110-DOP1 and 110-DOP2), and two dummy output pads (i.e., the first and second dummy output pads 120-DOP1 and 120-DOP2) are provided, as illustrated in FIGS. 4 through 6, the two dummy input pads (i.e., the first and second dummy input pads 110-DOP1 and 110-DOP2) are disposed between a pair of signal input pads (i.e., the third and fourth signal input pads 110-SIP3 and 110-SIP4) having a highest maximum bias ratio and between a pair of signal input pads (i.e., the first and second signal input pads 110-SIP1 and 110-W2) having a second highest maximum bias ratio, respectively, and the two dummy output pads (i.e., the first and second dummy output pads 120-DOP1 and 120-DOP2) are disposed between a pair of signal output pads (i.e., the third and fourth signal output pads 120-SOP3 and 120-SOP4) having a highest maximum bias ratio and between a pair of signal output pads (i.e., the first and second signal output pads 120-SOP1 and 120-SOP2) having a second highest maximum bias ratio, respectively.

While the exemplary embodiment of FIG. 7 has been described with respect to an example in which among a total of six pads provided, four pads are signal pads and the other two pads are dummy pads, embodiments of the present invention are not limited thereto. That is, more than six signal pads and more than two dummy pads may be provided, in which case, the dummy pads may be disposed between pairs of signal pads having highest maximum bias ratios.

Dummy pads are not necessarily disposed between pairs of signal pads having highest maximum bias ratios. In an exemplary embodiment, dummy pads are disposed between all pairs of signal pads having a maximum bias ratio of, for example, 50% or higher.

In the exemplary embodiment of FIG. 7, a maximum bias period is defined as a period in which a high-level voltage and a low-level voltage are provided to a pair of adjacent pads, respectively, but embodiments of the present invention are not limited thereto. That is, in another example, the maximum bias period may be defined differently. For example, the maximum bias period may be defined as a period in which the ratio between a high-level voltage and a low-level voltage provided to a pair of adjacent pads, respectively, exceeds a predetermined value of, for example, 90%. In still another example, the maximum bias period may be defined as a period in which the difference between a high-level voltage and a low-level voltage provided to a pair of adjacent pads, respectively, exceeds a predetermined value of, for example, 9V.

Figure 8:
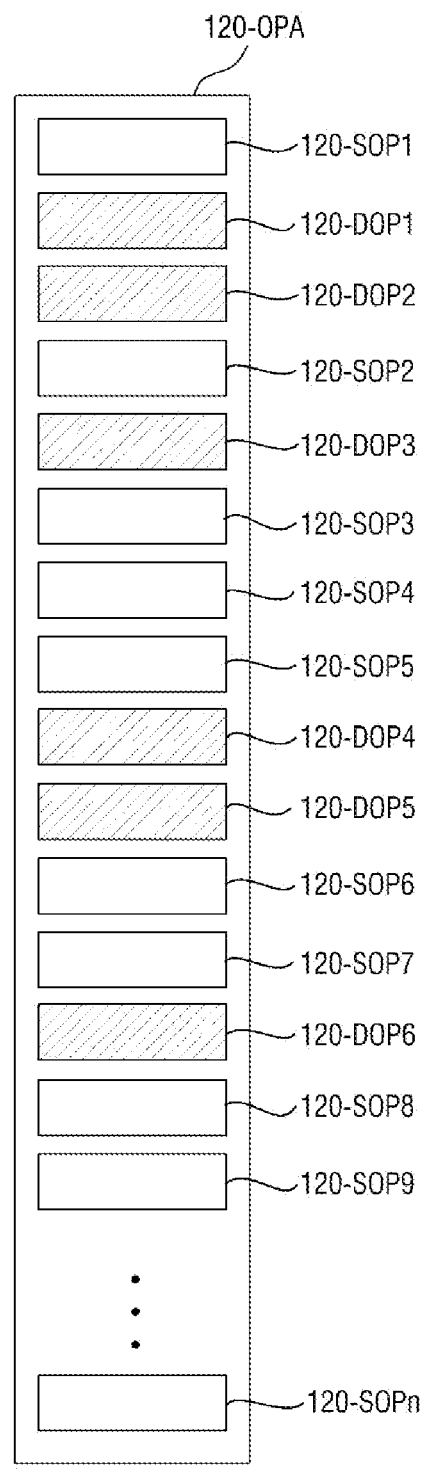
FIG. 8 is a layout view illustrating an output pad area of a flexible wiring board of a display device according to an exemplary embodiment of the present invention.

FIG. 8 is a layout view illustrating an output pad area of a flexible wiring board of a display device according to an exemplary embodiment of the present invention.

For convenience, all elements of the display device according to the exemplary embodiment of FIG. 8 except for an output pad area 120-OPA of a flexible wiring board are omitted from illustration in FIG. 8, and for the elements that are not shown in FIG. 8, the descriptions of the elements of the display device according to the exemplary embodiment of FIGS. 1 through 7 may directly apply.

Referring to FIG. 8, in the output pad area 120-OPA, first through n-th signal output pads 120-SOP1 through 120-SOPn and one or more dummy output pads, i.e., first through sixth dummy output pads 120-DOP1 through 120-DOP6, are disposed.

In an exemplary embodiment of FIG. 8, a dummy output pad is disposed between a pair of adjacent signal output pads having a maximum bias ratio greater than a first reference value, but smaller than a second reference value. The first and second reference values may be arbitrary numbers that satisfy Equation (3) as follows:

$$0 < \text{First Reference Value} < \text{Second Reference Value} \leq 100 \qquad \text{Equation (3)}.$$

In an embodiment, two dummy output pads are disposed between a pair of adjacent signal output pads having a maximum bias ratio greater than the second reference value.

By arranging dummy output pads in the above-described manner, the occurrence of a short circuit between each pair of adjacent signal output pads can be effectively minimized.

For convenience, it is assumed that the first reference value is 50% and the second reference value is 90%. It is also assumed that the first and second signal output pads 120-SOP1 and 120-SOP2 have a maximum bias ratio of 100%, the second and third signal output pads 120-SOP2 and 120-SOP3 have a maximum bias ratio of 70%, and the third and fourth signal output pads 120-SOP3 and 120-SOP4 have a maximum bias ratio of 30%.

Since the first and second signal output pads 120-SOP1 and 120-SOP2 have a maximum bias ratio greater than the second reference value, two dummy output pads, i.e., the first and second dummy output pads 120-DOP1 and 120-DOP2, are disposed between the first and second signal output pads 120-SOP1 and 120-SOP2.

Since the second and third signal output pads 120-SOP2 and 120-SOP3 have a maximum bias ratio greater than the first reference value, but smaller than the second reference value, only one dummy output pad, i.e., the third dummy output pad 120-DOP3, is disposed between the second and third signal output pads 120-SOP2 and 120-SOP3.

On the other hand, since the third and fourth signal output pads 120-SOP3 and 120-SOP4 have a maximum bias ratio smaller than the first reference value, the third and fourth signal output pads 120-SOP3 and 120-SOP4 are disposed next to each other with no dummy pad disposed therebetween.

While the electrical connection between a flexible wiring board and a main wiring board has not been specifically illustrated, it may correspond to the electrical connection between the input pads of a display panel and the output pads of the flexible wiring board. Also, while each of the display devices according to exemplary embodiments of the present disclosure has been described as including a display panel, one or more flexible wiring boards, and a main wiring board, embodiments of the present invention are not limited thereto. For example, some of the display panel, the flexible wiring boards, and the main wiring board may be omitted, or various electronic parts other than the display panel, the flexible wiring boards, and the main wiring board may be additionally provided.

As described above, although various embodiments have been described with reference to the limited drawings, those skilled in the art may apply various technical modifications and variations based on the above description. For example, appropriate results can be achieved even if the described technique is performed in a different order from the described method and/or the elements of the described system, structure, device, circuit and the like may be combined in a different form or replaced or substituted by other elements or equivalents.

What is claimed is:

1. A display device comprising:
    a display panel including first through n-th signal pads and a dummy pad; and
    at least one flexible wiring board providing signals to the first through n-th signal pads,
    wherein the dummy pad is disposed between k-th and (k+1)-th signal pads among the n signal pads,
    wherein a maximum bias period of signals provided to the k-th and (k+1)-th signal pads is longer than a maximum bias period of signals provided to another pair of the signal pads adjacent one another, and
    wherein n is a natural number greater than 1 and k is a natural number less than n.

2. The display device of claim 1, wherein each of the maximum bias periods is a period in which a difference in voltage between signals provided to a pair of the signal pads adjacent one another is maintained to be greater than a reference value.

3. The display device of claim 2, wherein the reference value is a difference between a high bias voltage and a low bias voltage of a driving chip that generates the signals.

4. The display device of claim 2, wherein the reference value is equal to or greater than a predetermined voltage.

* * * * *